United States Patent [19]

Harrison

[11] Patent Number: 4,827,219

[45] Date of Patent: May 2, 1989

[54] REMOTELY ADJUSTABLE MRI RF COIL IMPEDANCE MATCHING CIRCUIT WITH MUTUALLY COUPLED RESONATORS

[75] Inventor: William H. Harrison, Malibu, Calif.

[73] Assignee: The Regents of the University of California, Berkeley, Calif.

[21] Appl. No.: 141,427

[22] Filed: Jan. 7, 1988

[51] Int. Cl.$^4$ ............................................. G01R 33/20
[52] U.S. Cl. ...................................... 324/322; 333/32
[58] Field of Search .............. 324/309, 313, 314, 318, 324/322; 128/653; 333/24 R, 32, 33

[56] References Cited

U.S. PATENT DOCUMENTS

| | | | |
|---|---|---|---|
| 3,019,335 | 1/1962 | Brilliant | 333/32 |
| 4,545,384 | 10/1985 | Kawachi | 324/313 |
| 4,641,097 | 2/1987 | Bottomley et al. | 324/322 |
| 4,691,164 | 9/1987 | Haragashira | 324/322 |

Primary Examiner—Stewart J. Levy
Assistant Examiner—Louis M. Arana
Attorney, Agent, or Firm—Nixon & Vanderhye

[57] ABSTRACT

The RF coil and transmission line of a Magnetic Resonance Imaging (MRI) system are remotely tuned for variation from matched impedance conditions (e.g., as caused by variable loading of the RF coil by objects to be imaged which vary from an assumed median object) via a pair of series-connected over-coupled parallel-resonant circuits, each of which includes an adjustable capacitance.

11 Claims, 3 Drawing Sheets

INDUCTIVE - LOW Z

CAPACITIVE - HIGH Z

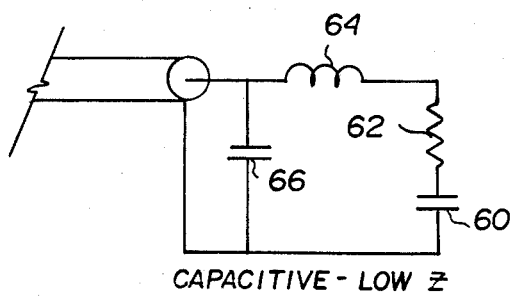
FIG. 5
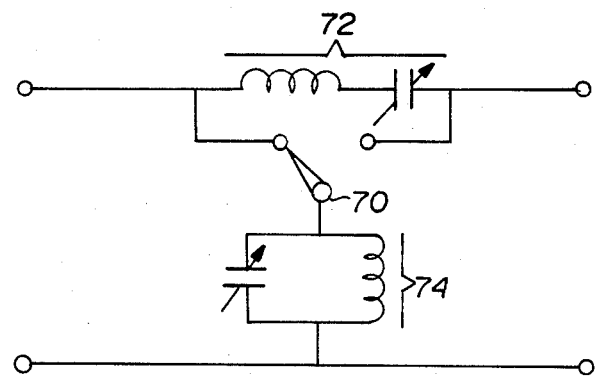
FIG. 6
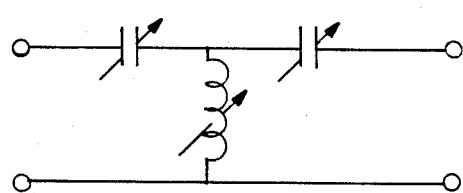
FIG. 7
FIG. 8
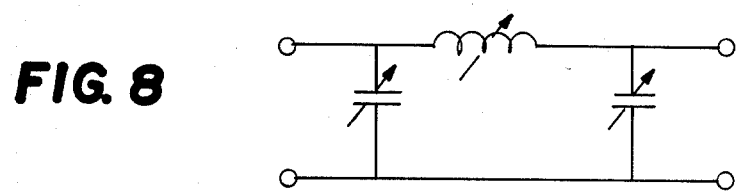

REMOTELY ADJUSTABLE MRI RF COIL IMPEDANCE MATCHING CIRCUIT WITH MUTUALY COUPLED RESONATORS

This invention relates to an improved Magnetic Resonance Imaging (MRI) system having a remotely tunable impedance matching network used to remotely adjust the input impedance of an RF coil to the 50 ohm (or other) impedance of a transmission line and/or other remotely located RF equipment. The RF coil requiring tuning typically is housed within a static magnet and gradient coil structure where its load impedance may vary considerably, i.e., it depends upon the size and composition of the object being imaged which is inherently coupled to the RF coil.

Magnetic resonance imaging (MRI) is now coming into wide spread commercial usage. The technique necessarily must transmit RF signals of predetermined frequency (e.g., approximately 15 MHz in some machines, the frequency depending upon the magnitude of magnetic fields employed and the magnetogyric ratio of the atoms to be imaged). Typically, exciting pulses of RF energy of a specified frequency are transmitted via an RF coil structure into an object to be imaged and, a short time later, radio frequency NMR responses are received by the same or similar RF coil structure. As will be appreciated by those in the art, it is possible to derive imaging information from such RF responses.

As will also be understood in the art, one significant limiting factor on the quality of such images is the attainable signal-to-noise ratio (SNR) of the RF responses which must be detected and processed. The signal level is enhanced and raised above the noise floor by the use of resonant circuits in the RF coil assembly that is used to transmit and/or receive the RF energy.

It is necessary to include a transmission line between the MRI processing circuits (including suitable RF transmit/receive circuits) and the RF coil assembly or "applicator" which must necessarily be remotely housed within the cryogenic magnet and magnetic gradient coils. The signal-to-noise ratio is optimized when the RF coil/applicator is resonated so that the impedance looking into the coil/applicator is "matched" or made equal (e.g., 50 ohms) to the transmission line impedance that connects it to the processing equipment.

The load impedance seen by the coil/applicator will vary considerably depending upon the mass and composition of the material being imaged. In the past, optimum performance (best SNR) was obtained by making an inconvenient internal impedance adjustment to the RF coil (i.e., to an RF tuning/matching circuit located at the coil site) each time a new object was to be imaged.

A new tuning device has been developed, requiring only two controls, and which remotely corrects the undesired impedance variations (any phase angle of predetermined magnitude). It can be conveniently housed in the equipment rack, typically located about 20 feet from the RF coil/applicator.

These as well as other objects and advantages of the invention will be more completely understood and appreciated by carefully reading the following detailed description of a presently preferred exemplary embodiment, taken in conjunction with the drawings, of which:

Figure 9A:
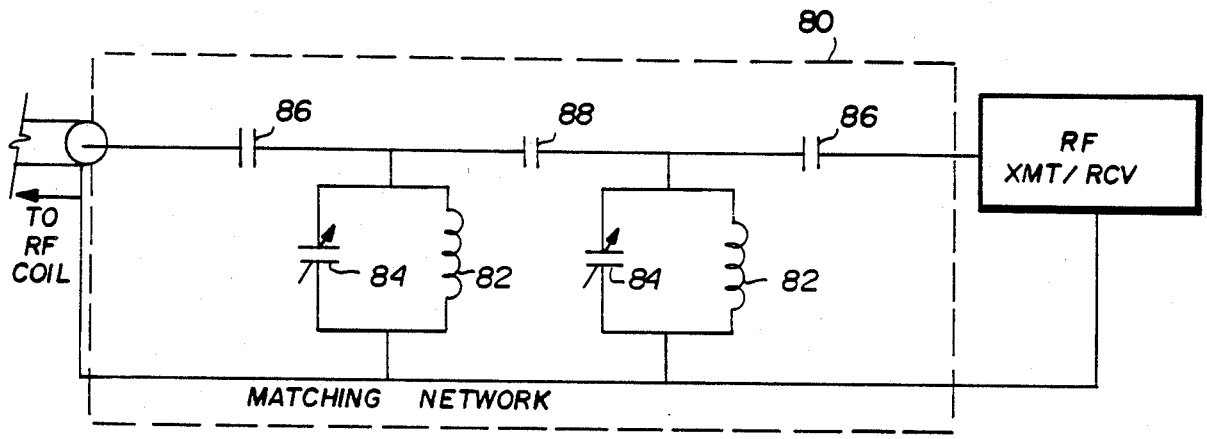

FIGS. 3–8 describe various other possible techniques for achieving an impedance match between the applicator and the RF transmission line;

FIG. 9a is a schematic of an exemplary improved matching network; and

Figure 9B:
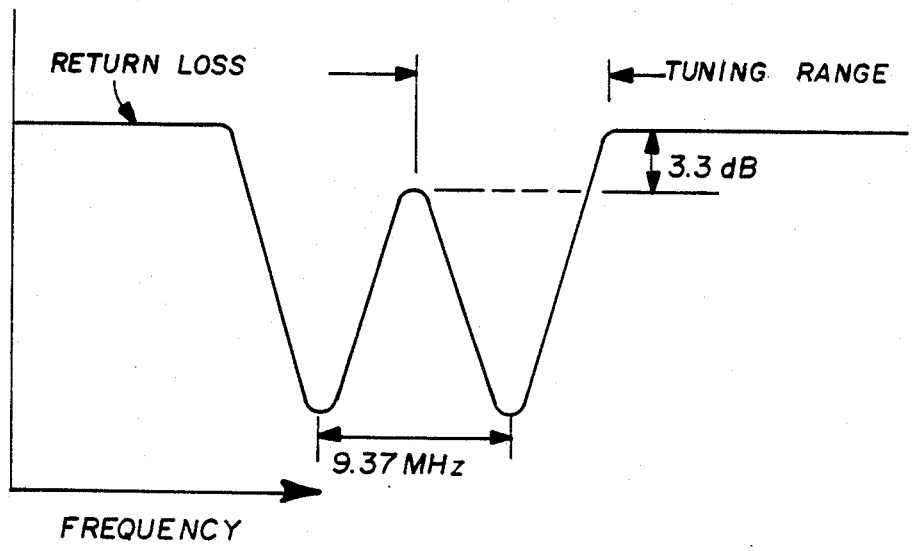

FIG. 9b is a response curve of the return loss seen at the input to the matching network of FIG. 9a when connected to a matched (e.g., 50 ohm) load.

Figure 1:
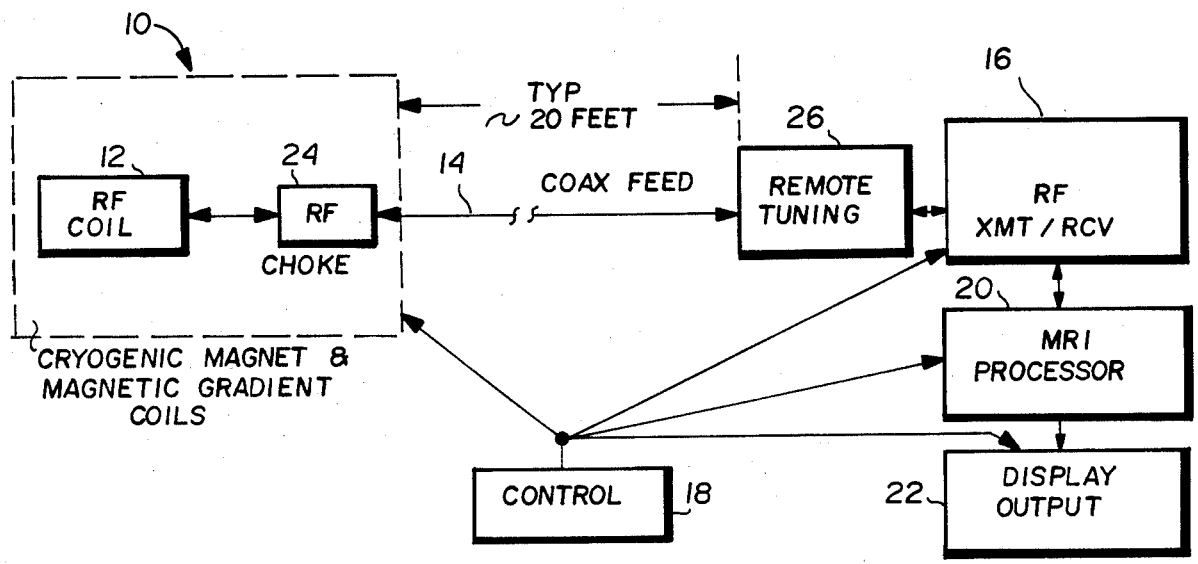
FIG. 1 is a schematic block diagram of an MRI system utilizing the remote tuning network of this invention.

An abbreviated schematic depiction of a magnetic resonance imaging (MRI) system is shown in FIG. 1. The system includes a very large cryogenic magnet and magnetic gradient coils 10 (the magnetic gradient coils are typically pulsed to provide different gradient levels at different times in the imaging process). Located within this rather massive assembly 10 is an RF coil/applicator 12 that communicates via transmission line 14 (and a possible RF choke 24 sometimes incorporated in the outer coaxial cable shield so as to limit passage of spurious surface mode RF signals thereover) and remote impedance matching network 26 with the external RF transmit and receive circuits 16. Suitable control circuits 18 control the magnetic gradient coils as well as the RF transmit/receive section 16, the MRI image processor 20 and the display output 22. Relevant to the present invention, is the fact that the RF coil 12 is linked via the transmission line 14 to the remote impedance matching network 26 that connects to the RF transmit/receive circuits 16 which are typically necessarily located externally (e.g., several meters from the RF coil 12).

The remote impedance matching network 26, the subject of this invention, is located adjacent the transmit/receive circuits 16 and is used to correct any impedance variations that occur in the RF coil applicator as a result of load variations. That is, if the coil 12 is not matched to transmission line 14 at the coil site, then a complex RF impedance will be transformed/reflected along the length of line 14 (in accordance with the usual Smith Chart analysis) to some other complex RF impedance at the site of the remote tuning network 26. This resulting complex impedance may then be matched at that point (i.e., remote from coil 12) before the RF signal is fed to/from the standard RF xmt/rcv circuits 16 (or some intervening further transmission line).

It should be pointed out that the remote impedance matching network 26 does not necessarily replace the conventional matching network that typically is an integral part of RF coil 12 (i.e., located thereat). Rather, the internal matching network preferably is initially optimized for a median object to be imaged and then variations occurring after that initial adjustment are made at the remote tuning site. It should also be noted that the type of internal matching network used in the RF coil typically would not function properly at the remote site for reasons that will now be described in detail.

There are many different types of adjustable impedance matching circuits including an L-network that may be used internally in the RF coil itself. However, each of such possible devices (FIGS. 3–8) has undesired limitations with respect to a remote matching approach that are overcome with the new device, as will be explained.

Figure 2:
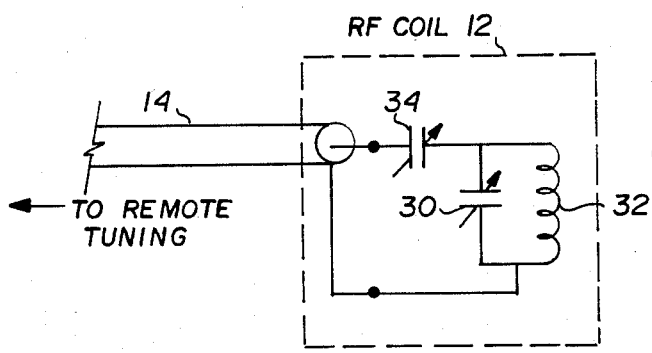
FIG. 2 illustrates typical prior art tuning of the coil/applicator at the imaging site (L-network) where the matching network becomes a part of the applicator.

FIG. 2 illustrates an unbalanced L-network of a type sometimes used internally with the RF coil 12, i.e., a shunt capacitor 30 across the inductance 32 of the RF coil (to resonate it) followed by a series capacitor 34 (to lower the resistance to 50 ohms) which connects it to the 50 ohm transmission line 14. This impedance matching circuit can only be used where the load (RF coil in this case) is inductive and when its impedance is higher than the transmission line impedance.

Figure 3:
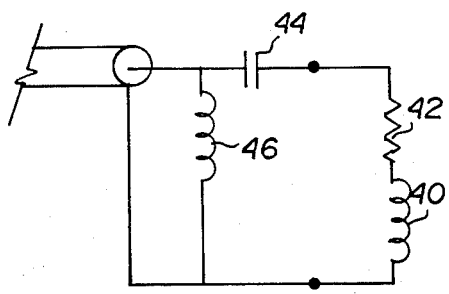
Figure 4:
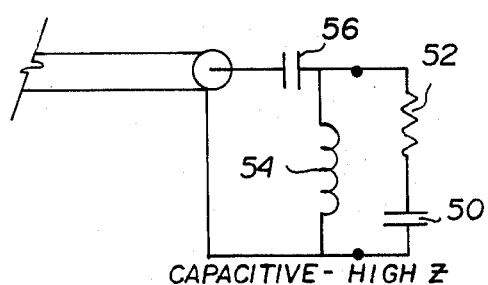

The same circuit thus can not be used remotely to correct for RF coil impedance changes because an impedance seen at the remote location (resulting from variation in the size and composition of various objects being imaged) is of unpredictable sign and magnitude due to its transformation along the intervening transmission line (i.e., capacitive or inductive and with the R value being higher or lower than 50 ohms). FIGS. 3, 4 and 5 show additional L-network combinations that could be used to transform various impedance combinations to 50 ohms. Each is used for a specific impedance correction. FIG. 3 transforms an inductive impedance 40, low resistance value impedance 42 to 50 ohms by means of a series capacitor 44 and a shunt inductor 46.

FIG. 4 converts a capacitive impedance 50, high resistance value impedance 52 to 50 ohms by means of a shunt inductance 54 followed with a series capacitor 56. FIG. 5 transforms a capacitive impedance 60, low resistance value impedance 62 to 50 ohms with a series inductance 64 and a shunt capacity 66.

Thus, as may be seen, none of these L-networks are all inclusive and no single one can be used for remote tuning because of their limited respective impedance ranges.

With reference to FIG. 6, if a switch 70 is installed in an L-network that allows the shunt element to be attached to either the input or output of the L-network, the various necessary impedance combinations can be obtained. This network has also been extended to use a series resonant circuit 72 in the series path and a parallel resonant circuit 74 in the shunt path to obtain either inductive or capacitive reactances in both the circuit elements. Thus, with the switching feature shown in FIG. 6, all of the required impedance transformation combinations are achievable. But, three interactive adjustments (including switch) are necessary to accomplish the task and actually achieving the required combination in an efficient and reliable manner can be very elusive.

The T-network and Pi-network, shown respectively in FIGS. 7 and 8, add a third reactive element to the circuit. Both circuits are more versatile than the L-networks just described and by chosing proper reactance values, either the T or Pi network can be used to match all of the possible impedance combinations that can occur at the remote location of the desired tuning device.

However, to correct all impedance variations created by a VSWR of, for example, 4 to 1, all three elements of the T or Pi network must be adjustable. Clinically (as with the switchable T-network) this is undesirable because it requires three interactive adjustments and it is often very difficult for the technician to find a combination of the three that will create the desired impedance match.

The presently preferred exemplary embodiment, FIG. 9a, employs two resonant, over-coupled circuits that produce the necessary phase shift and impedance amplitude adjustments required to match any predetermined impedance level within a practical expected range. In this case, experiments with an MRI RF coil-/applicator have established that impedance variations resulting in VSWR levels of 2 or 3 to 1 are typically produced with different loading conditions of the RF coil after it is initially tuned. However, the new matching network is designed to accommodate VSWR levels up to 4 to 1 in case such anticipated values are somewhat exceeded.

The new matching network 80 shown in FIG. 9a includes two identical parallel resonant circuits made up of inductors 82 and capacitors 84, 86 and 88. The circuit is actually that of a two resonator bandpass filter where the relationship between capacitors 86 and 88 have been chosen to over couple the circuits to produce the response shown in FIG. 9b.

Only two controls are required to adjust the impedance of the RF coil to 50 ohms when the impedance of the RF coil, as seen at the remote site, is such as to produce a VSWR, of any phase, up to 4 to 1. When capacitor 88 is made equal to capacitors 86, the theoretical over coupled response should produce a 3.0 dB return loss at the mid frequency of the response. As may be seen the measured value is 3.3 dB, in good agreement when circuit losses are considered.

The relationship of the inductance 82 and capacitor 84 values was chosen so that an acceptable reactance range is available at the operating frequency, which in this exemplary case is 15 MHz. The design technique however can be used at any frequency of interest. These values were also chosen so that the maximum tuning adjustment would just cover the range marked on the response curve of FIG. 9a so that no ambiguity can occur (where there could be two combinations of tuning that appear to lead to an impedance match, but one may only lead to a partial match). It is advantageous to establish this maximum tuning range feature to prevent ambiguity if the system is automated where sensing devices would attempt to follow the wrong path. As will be understood, tuning procedure would typically involve iterative adjustment of the variable capacitors 84 so as to successively minimize VSWR (or maximze RF power transfer).

Physical values of the circuit elements for this exemplary specific design were chosen as follows:
  Variable capacitors (84)—19-488 Pf
  Fixed capacitors (86)—200 Pf
  Fixed capacitor (88)—200 Pf
  Inductors (82)—0.40 Microhenry The same principles and circuit relationships would be employed for operation at other frequencies.

While only a few exemplary embodiments have been described in detail, those skilled in the art will recognize that many variations and modifications may be made in such embodiment(s) while yet retaining many of the novel features and advantages of this invention. All such modifications and variations are intended to be included within the scope of the appended claims.

What is claimed is:

1. A magnetic resonance imaging (MRI) system comprising:
   an RF coil assembly located during use within a magnetic field generating assembly;
   RF circuits located remotely from said RF coil assembly and operatively connected with MRI control, processing and image output circuits;
   an impedance match tuning network also located remotely from said RF coil assembly and connected with said RF circuits; and a single RF transmission line interconnecting said RF coil assembly with said impedance match tuning network so as to provide an RF connection between said RF coil assembly and said remotely located RF circuits via said remotely located impedance match tuning network;

said impedance match tuning network including two and only two adjustable impedances therewithin for achieving a matched RF impedance condition between said RF coil assembly, RF transmission line and RF circuits over at least a 2:1 VSWR associated with either inductive or capacitive loads.

2. A magnetic resonance imaging (MRI) system comprising:

an RF coil assembly located during use within a magnetic field generating assembly;

RF circuit located remotely from said RC coil assembly and operatively connected with MRI control processing and image output circuits;

an impedance match tuning network also located remotely from said RF coil assembly and connected with said circuits; and an RF transmission line interconnecting said RF coil assembly with said impedance match tuning network so as to provide an RF connection between said RF coil assembly and said remotely located RF circuits via said remotely located impedance match tuning network;

said impedance match tuning network including two adjustable impedances therewithin for achieving a matched RF impedance condition between said RF coil assembly, RF transmission line and RF circuits over at least a 2:1 VSWR associated with either inductive or capacitive loads;

said impedance matching tuning network including a first parallel resonant circuit having an adjustable capacitor;

a second parallel resonant circuit also having an adjustable capacitor;

said first and second parallel resonant circuits being connected together in series, via a first coupling capacitance and respectively to RF input and output ports via second and third coupling capacitances, said coupling capacitances being chosen to mutually over-couple said first and second parallel resonant circuits.

3. A magnetic resonance imaging (MRI) system as in claim 2 wherein said RF input port is connected to said RF transmission line and said RF output port is connected to said RF circuits.

4. A magnetic resonance imaging (MRI) system as in claim 2 wherein said impedance match tuning network comprises:

a pair of series-connected, over-coupled, parallel-resonant circuits, each of which includes an adjustable reactance.

5. In a magnetic resonance imaging (MRI) system of the type which includes a static field magnet, pulsed magnetic gradient coils, and an RF coil assembly mounted therein and communicating RF signals of predetermined frequency via at least one coaxial cable to and/or from remotely located MRI processing circuits including RF signal transmitting and receiving circuits, the improvement comprising:

a remote impedance matching circuit disposed serially with said coaxial cable and located in or near said transmitting and receiving circuits so that RF coil assembly impedance adjustments can be made at the remote location:

said remote impedance matching circuit including (a) two parallel resonant circuits that are coupled with a first fixed capacitance while capacitive input and output connections to the parallel resonant circuits are made with two further fixed capacitances;

(b) the two parallel resonance circuits each including a fixed inductor and a variable shunt capacitor for adjusting the incoming impedance from the RF coil to a matched condition.

6. An improved MRI system as in claim 5 wherein the shunt capacitor elements of the matching network are adjustable so that an impedance of any phase with a resulting VSWR of at least 4 to 1 can be transformed to 50 ohms.

7. An improved MRI system as in claim 6 wherein the shunt capacitor elements are capable of providing the impedance correction required with only one unambiguous setting of the two variable capacitors.

8. An improved MRI system as in claim 1, 2, 3, 4, 5, 6 or 7 wherein said RF coil assembly includes impedance matching elements located thereat for achieving a matched impedance to the RF transmission line for an assumed median object to be imaged and wherein said remotely located impedance matching elements are used to compensate for deviations from said median object.

9. A magnetic resonance imaging method for maintaining a matched RF impedance condition between an MRI RF coil coupled to an object to be imaged and remotely located MRI RF circuits for transmitting and/or receiving MRI RF signals into and/or out of said object during magnetic resonance imaging procedures, said method comprising the steps of:

first adjusting local RF impedance match circuits located substantially at said RF coil so as to achieve a matched impedance between the RF coil and an RF transmission line connecting said RF coil to said MRI RF circuits for a predetermined median object to be imaged;

secondly adjusting remote RF impedance match circuits located remotely from said RF coil so as to maintain a matched impedance condition between said RF coil and said MRI RF circuits by thus remotely compensating for load variations between an actual object to be imaged and said predetermined median object.

10. A method as in claim 9 wherein said first adjusting step is not performed for each actual object to be imaged and said secondly adjusting step is performed for each actual object to be imaged.

11. A method as in claim 9 wherein said secondly adjusting step includes adjustment of a pair of variable capacitances, each of which is included within a separate one of a pair of series-connected over-coupled, parallel-resonant circuits.

* * * * *